(12) United States Patent
Wyville et al.

(10) Patent No.: US 8,493,258 B1
(45) Date of Patent: Jul. 23, 2013

(54) DIGITAL-TO-ANALOG CONVERTER IMAGE SUPPRESSION WITH HILBERT TRANSFORM

(75) Inventors: Mark William Wyville, Ottawa (CA); Edward Matthew Sich, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 15 days.

(21) Appl. No.: 13/403,660

(22) Filed: Feb. 23, 2012

(51) Int. Cl.
*H03M 1/66* (2006.01)

(52) U.S. Cl.
USPC .......................................... 341/144; 341/143

(58) Field of Classification Search
USPC .......... 341/143, 155, 144, 118, 120; 375/295; 370/342
See application file for complete search history.

(56) References Cited

U.S. PATENT DOCUMENTS

| | | | |
|---|---|---|---|
| 6,310,870 B1 * | 10/2001 | Li | 370/342 |
| 7,054,382 B2 * | 5/2006 | Lee | 375/295 |
| 7,107,022 B1 | 9/2006 | Thomas et al. | |
| 7,130,357 B2 * | 10/2006 | Moon et al. | 375/296 |
| 7,482,960 B2 * | 1/2009 | Kufer | 341/144 |
| 7,515,662 B2 * | 4/2009 | Park et al. | 375/350 |
| 7,535,389 B1 * | 5/2009 | Teterwak | 341/118 |

\* cited by examiner

*Primary Examiner* — Peguy Jean Pierre
(74) *Attorney, Agent, or Firm* — Christopher & Weisberg, P.A.

(57) ABSTRACT

A method and apparatus for suppressing a first replica of an image spectra and reinforcing a second replica of the image spectra are disclosed. A Hilbert transformer is applied to a first digital signal in a first path. The Hilbert-transformed signal in the first path is converted to an analog signal in the first path. The analog signal in the first path is delayed by an additional 90 degrees to produce a first phase-shifted analog signal. A phase delay is applied to the first digital signal in the second path and the phase-delayed signal in the second path is converted to analog to produce a second phase-shifted analog signal. A combiner combines the first and second phase-delayed analog signals to produce an analog output signal with at least one replica of the image spectra that is substantially suppressed.

20 Claims, 4 Drawing Sheets

DIGITAL-TO-ANALOG CONVERTER IMAGE SUPPRESSION WITH HILBERT TRANSFORM

TECHNICAL FIELD

The present invention relates to wireless communication, and in particular to a method and system for image spectra suppression in a digital signal.

BACKGROUND

Digital processors are used in modern communication devices to perform complex signal processing while adhering to reasonable power and size constraints. For example, in order to transfer information from one radio to another radio, digital signals are converted into analog transmission signals. This conversion process is performed by a digital-to-analog converter (DAC).

The frequency representation of a digital signal consists of an infinite number of replicas of the equivalent baseband analog signal. The replicas, also referred to as image spectra, are separated in the frequency domain by $f_s$, which is the frequency of the digital sampling clock. All but one replica must be suppressed at the output of a digital-to-analog converter (DAC). Otherwise, due to the close frequency spacing of the replicas, non-linear action in an up-conversion mixer or power amplifier will result in inter-modulation distortion in the pass band.

In the frequency representation of the signal, the signal energy that lies between zero and $f_s/2$ is said to be in the first Nyquist zone. The signal energy that lies between $f_s/2$ and $f_s$ is said to be in the second Nyquist zone. The third Nyquist zone is between $f_s$ and $3f_s/2$, etc. Conventionally the signal energy in the first Nyquist zone is the desired replica. The higher frequency replicas are suppressed at the DAC output by an analog low-pass filter and the sample-and-hold function of the DAC. However, a low-pass filter used at the output of the conventional DAC does not integrate well onto integrated circuit chips due to the large physical area consumed by the filter and the precision issues related to passive devices.

In an alternative approach, the digital-to-analog conversion and frequency up-conversion can be achieved by using a higher frequency replica at the DAC output instead of the replica in the first Nyquist zone. This approach uses a band pass filter at the DAC output to suppress the other replicas. The band pass filter could be centered at $3f_s$ with a pass band bandwidth equal to $f_s$. This technique is useful when the desired transmit signal is centered at a multiple of the sampling frequency. Also, a sample-and-hold function of the DAC must not suppress the desired higher-frequency replica (like the return-to-zero, or 2-phase return-to-zero).

However, transmitters may need to operate in multiple frequency bands. The digital clock frequency within these transmitters cannot easily be changed to ensure that a high-frequency replica lands exactly at the desired transmit frequency. Therefore, the baseband signal is shifted from DC to some digital IF frequency ($f_{IF}$) to offset the replicas away from multiples of the clock frequency. The band pass filter at the DAC output must choose only one of the high frequency replicas. If two replicas are closely spaced in the frequency domain then there is a small region for the filter to transition from pass band to stop band. A short transition region requires a highly selective filter, which means the filter must be physically large and complex to design.

Therefore, what is needed is a method and system for performing digital-to-analog conversion that suppresses unwanted image spectra, does not require highly selective filtering, and scalable to other frequencies.

SUMMARY

The present invention advantageously provides a method and system for suppressing a first replica of an image spectra and reinforcing a second replica of the image spectra, the second replica being adjacent to the first replica. According to one aspect, the invention provides a device for converting a digital input signal to an analog signal. The device includes a first path and a second path. The first path has a transformer and a first digital-to-analog converter (DAC). The transformer phase-shifts replicas of the image spectra of the input signal that fall in even Nyquist zones by substantially a first predetermined amount and phase-shifts replicas of the image spectra that fall in odd Nyquist zones by substantially the negative of the first predetermined amount. The first DAC converts the transformed input signal in the first path to a first analog signal in the first path. The second path has a coarse delay compensator and a second DAC. The coarse delay compensator delays the digital input signal in the second path by an integer number of clock cycles. The second DAC converts the coarse-delayed signal to a second analog signal in the second path. The device also includes a combiner that combines the first analog signal with the second analog signal to produce an output signal with at least one replica of the image spectra being substantially suppressed.

According to another aspect, the invention provides a method of suppressing image spectra of a digital input signal. The method includes splitting the digital input signal into a first path and a second path. The first path has a Hilbert transformer, a first DAC and an analog phase delay device. The Hilbert transformer phase-shifts replicas of the image spectra that fall within even Nyquist zones by substantially 90 degrees and phase-shifts replicas of the image spectra that fall within odd Nyquist zones by substantially −90 degrees, to produce a first digital signal. The DAC converts the first digital signal to a first analog signal. The analog phase delay device delays the first analog signal by an additional 90 degrees. The second path has a compensation device and a second DAC. The compensation device compensates for a phase delay introduced by the Hilbert transformer and the first DAC of the first path to produce a second digital signal. The second DAC converts the second digital signal to a second analog signal. The method further includes combining the first and second analog signals from the two paths to produce an output analog signal with at least one replica of the image spectra suppressed.

According to another aspect, the invention provides a radio frequency (RF) device having a first path and a second path. The first path has a transformer arranged to phase shift replicas of an image spectra of a digital input signal. The first path also has a first DAC that converts the output of the transformer to a first analog signal. The second path has a compensator that compensates for a group delay response of at least the transformer. The second path also has a second DAC to convert an output of the compensator to produce a second analog signal. A combiner combines the first and second analog signals to produce an analog output signal having at least one substantially suppressed replica of the image spectra.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
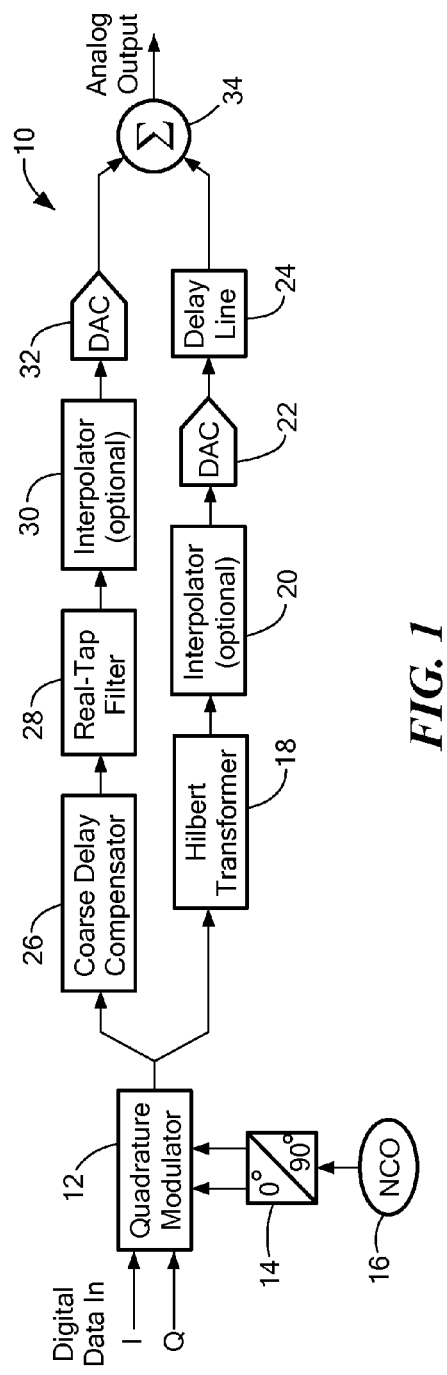
FIG. 1 is a block diagram of an exemplary transmitter circuit constructed in accordance with principles of the present invention.

Before describing in detail exemplary embodiments that are in accordance with the present invention, it is noted that the embodiments reside primarily in combinations of apparatus components and processing steps related to image suppression in a radio frequency (RF) signal of a wireless communication system. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

In embodiments described herein, analog outputs from two paths are combined in a manner to attenuate a replica of the image spectra of a signal in one of the Nyquist zones. Prior to combining the analog outputs from two paths, at least one of the paths does not exhibit both an anti-symmetric phase response and a symmetric magnitude response about the multiple of the digital clock frequency that borders the Nyquist zone containing the replica to be attenuated. If the undesirable replica is located at $Nf_s+f_{IF}$ or $Nf_s-f_{IF}$, then the frequency to which the symmetry conditions refer is $Nf_s$. Here, N is an integer and $f_{IF}$ is the up-conversion frequency in the digital domain.

Referring now to the drawing figures, in which like reference designators denote like elements, there is shown in FIG. 1 a diagram of an exemplary transmitter circuit constructed in accordance with principles of the present invention, and generally denoted as system "10." System 10 may include a quadrature modulator 12 that receives in-phase (I) signals and quadrature-phase (Q) signals and mixes them with a cosine wave and sine wave, respectively, to perform intermediate frequency (IF) conversion in the digital domain. The cosine wave and sine wave are obtained from a phase shifter 14 that receives a digital sine wave from a numerically controlled oscillator 16.

The output of the modulator 12 is split into two paths. The first path includes a Hilbert transformer 18, an optional interpolator 20, a digital-to-analog converter (DAC) 22 and a delay line 24. The second path includes a coarse delay compensator 26, a real tap filter 28, an optional interpolator 30, and a DAC 32. The outputs of each path are combined by an adder 34 to produce an analog RF output with a desired replica suppressed, as will be explained below.

In the lower path of FIG. 1, the Hilbert transformer 18 causes a minus 90 degrees phase shift to the first Nyquist zone of the signal, a plus 90 degrees phase shift to the second Nyquist zone, a minus 90 degrees phase shift to the third Nyquist zone, etc, such that each odd Nyquist zone undergoes a minus 90 degrees phase shift and each even Nyquist zone undergoes a plus 90 degrees phase shift. The delay line 24 introduces nearly a plus 90 degrees phase shift or a minus 90 degrees phase shift to one of the replicas so that the chosen replica is attenuated while a neighboring replica is reinforced. The reinforced replica is the desired analog RF output. The remaining replicas that are not suppressed are sufficiently separated from the reinforced replica, so that they may be easily filtered with a smaller, lower order filter.

The interpolators 20 and 30 are optional and may be used to increase the spacing between replicas within even numbered Nyquist zones, and between replicas within odd Nyquist zones. This has the effect of relaxing a filter selectivity requirement. The DAC 22 performs a digital-to-analog conversion of the signal and is constructed so that the sample-and-hold frequency response of the DAC 22 does not excessively attenuate the desired replica.

In the upper path of FIG. 1, the coarse delay compensator 26 introduces an integer number of delays to compensate for the group delay of the Hilbert transformer 18. The real tap filter 28 adjusts the phase and fine-tunes the group delay at the IF frequency $f_{IF}$ to compensate for the phase response of the delay line at $Nf_s \pm f_{IF}$, which may deviate from exactly $\pm 90°$.

The real tap filter 28 can be an all-pass filter in order to keep the magnitude responses of the two paths equal. Consequently, a transfer function of a second order real tap filter 28 has real coefficients with poles at $\alpha$ and $\alpha^*$ and zeros at $1/\alpha$ and $1/\alpha^*$, where * denotes the complex conjugate. The variable $\alpha$ is a real number less than 1, and is chosen based on a desired group delay. The optional interpolator 30 and the DAC 32 perform the same functions as for interpolator 20 and DAC 22, respectively.

The outputs of the two paths are combined in a combiner 34, which may be an adder or a subtractor, depending upon which replica is to be attenuated and which replica is to be reinforced. Thus, one embodiment produces an analog output signal with at least one of the replicas of the image spectra of the digital input signal suppressed and with at least one of the replicas of the image spectra of the digital input signal reinforced.

Figure 2:
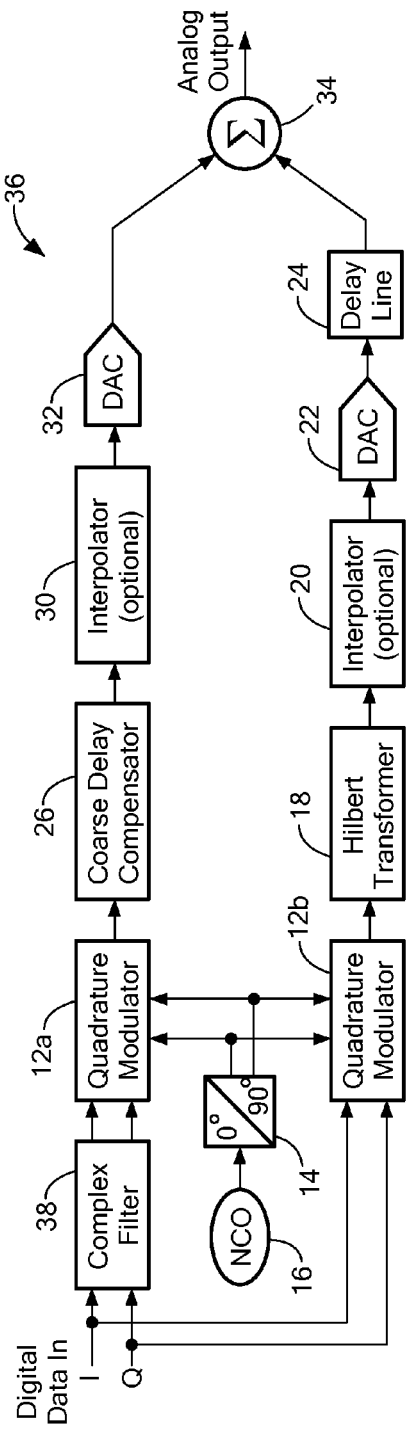
FIG. 2 is a block diagram of an exemplary alternative transmitter circuit constructed in accordance with principles of the present invention.

FIG. 2 is a block diagram of an exemplary alternative transmitter circuit 36 constructed in accordance with principles of the present invention. In FIG. 2, the real tap filter 28 of FIG. 1 is replaced with a complex filter 38 prior to quadrature modulation by quadrature modulators 12a and 12b. The complex filter 38 processes complex data and can have complex-valued coefficients. A role of the complex filter 38 is to compensate for any mismatches between the actual and desired outputs of the upper path of the embodiment of FIG. 2. The complex filter 38 provides a phase response that compensates for a deviation from plus or minus 90 degrees of the delay line 24 in the second (lower) path in the band of the desired replica.

Figure 3:
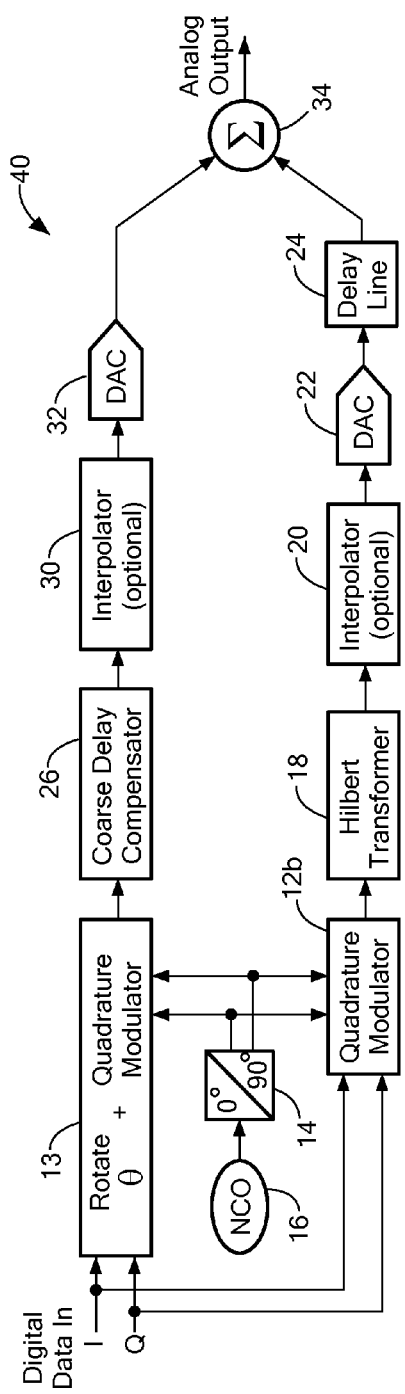
FIG. 3 is a block diagram of an exemplary alternative transmitter circuit constructed in accordance with principles of the present invention.

FIG. 3 is a block diagram of an exemplary alternative transmitter circuit constructed in accordance with principles of the present invention. In FIG. 3, the complex data (I and Q) is rotated by a fixed angle by a rotation-and-quadrature modulator 13, rather than being complex-filtered as in the embodiment of FIG. 2. The rotation is used to compensate for the phase error that arises from the delay line 24 not being exactly plus or minus 90 degrees at $Nf_s \pm f_{IF}$. This rotation causes maximum attenuation at the center frequency of the undesired replica, but the group delay is not matched as it is with the embodiments of FIGS. 1 and 2. Matching the phase but not the group delay causes a narrower attenuation bandwidth of the replica. Although FIG. 3 shows delay line 24 as the analog element that provides phase shift, it is understood that any element that provides a phase shift in one path can be used.

Figure 4:
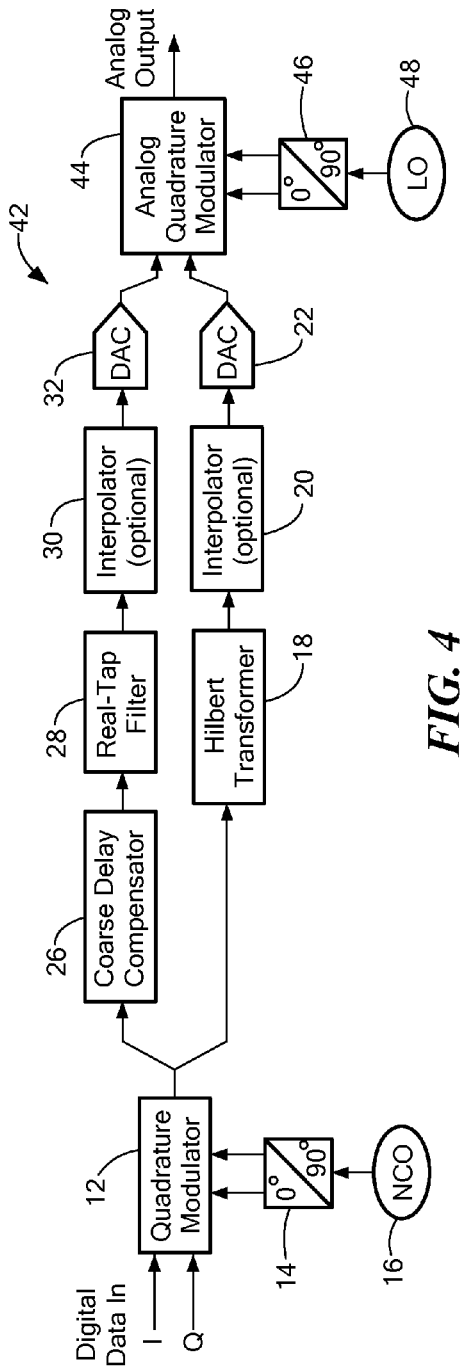
FIG. 4 is a block diagram of an exemplary alternative transmitter circuit constructed in accordance with principles of the present invention.

FIG. 4 is a block diagram of an exemplary alternative transmitter circuit constructed in accordance with principles of the present invention. FIG. 4 is similar to the configuration of FIG. 1 except that the delay line 24 of FIG. 1 is replaced by an analog quadrature modulator 44, fed by a sine wave and a cosine wave. More particularly, the analog quadrature modulator 44 mixes the signal from each path by the sine wave and the cosine wave, respectively. The cosine wave and sine wave are obtained from a phase shifter 46 that receives an analog sine wave from a local oscillator 48. A function of the analog quadrature modulator 44 is to obtain a plus or minus 90 degrees phase shift between the two paths. The fine delay compensation for minor phase deviation in the analog quadrature modulator 44 may be provided by introducing one of the filters or rotation components of FIGS. 1, 2 and 3.

Figure 5:
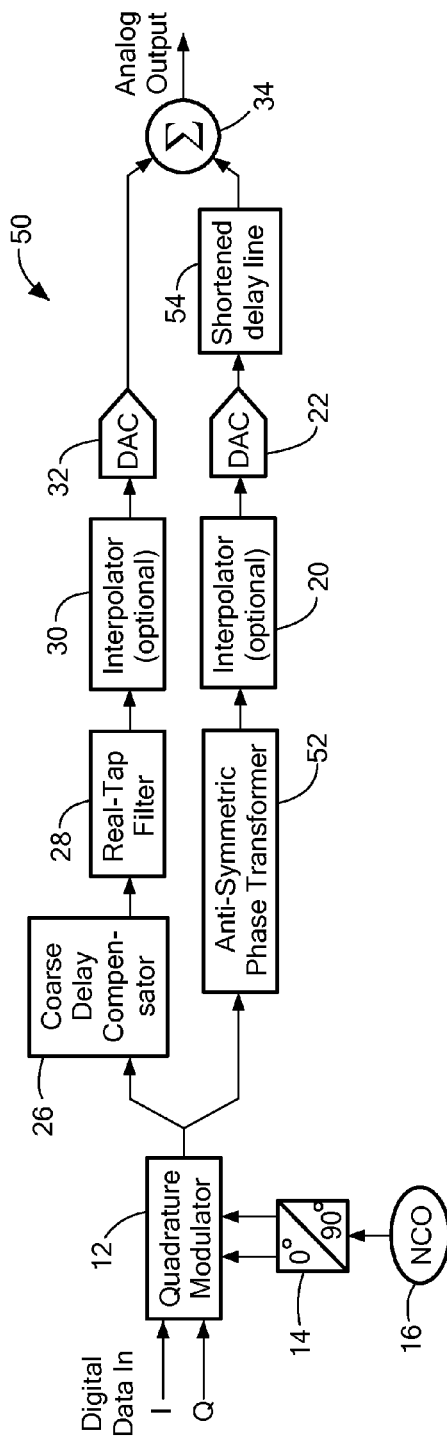
FIG. 5 is a block diagram of an exemplary alternative transmitter circuit constructed in accordance with principles of the present invention.

FIG. 5 is a block diagram of an exemplary alternative transmitter circuit constructed in accordance with principles of the present invention. The embodiment of FIG. 5 includes a transformer 52 that produces a delay of ±θ in alternating Nyquist zones, and is therefore a generalization of the Hilbert transformer 18. In this case, the shortened delay line 54 produces a delay of ±θ so that the delay between paths at the desired frequency is 180°−2θ. This phase relationship results in a degradation of the magnitude response at the output of the combiner 35. When the shortened delay line 54 is larger than λ/8, then the degradation of the desired replica is less than −3 dB.

Figure 6:
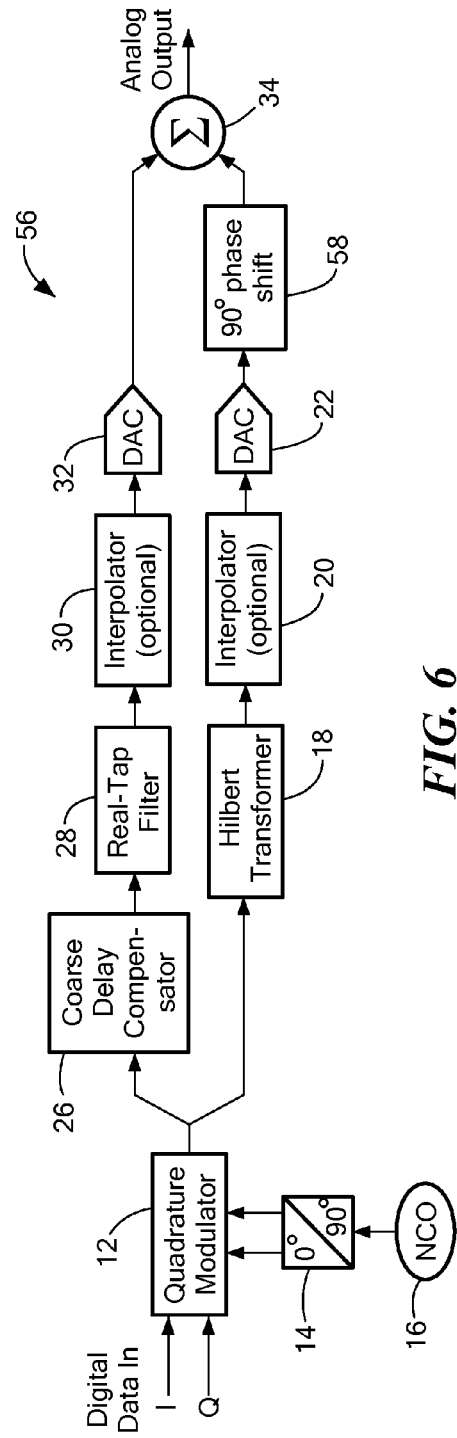
FIG. 6 is a block diagram of an exemplary alternative transmitter circuit constructed in accordance with principles of the present invention.

FIG. 6 is a block diagram of an exemplary alternative transmitter circuit constructed in accordance with principles of the present invention. In the embodiment of FIG. 6, the delay line 24 is replaced by an analog phase shifter 58. In an alternative embodiment, a single component can be employed to implement the analog phase shift of the analog phase shifter 58 and the combiner 34.

Thus, embodiments enable suppression of one of two closely spaced replicas from a digital-to-analog converter in a manner that avoids use of a highly selective analog filter. In the embodiment of FIG. 1, only one quadrature modulator is used. The real tap filter 28 can be a low order all pass infinite impulse response (IIR) filter. A lower order filter advantageously results in fewer mathematical operations, resulting in lower power consumption and reduced size. Using the real tap filter results in more accurate fine tuning of the group delay, which results in better attenuation over the desired attenuation bandwidth.

In the embodiment of FIG. 2, a finite impulse response (FIR) filter can be used that is simpler to design than an IIR filter and can be constrained to exhibit a linear phase response over an entire baseband bandwidth. In the embodiment of FIG. 3, digital filtering is not used, but a more complex digital quadrature modulator 13 may be used. The embodiment of FIG. 4 omits the delay line 24 which advantageously decreases the overall size of the transmitter circuit 42. The embodiment of FIG. 5 uses a smaller delay line than the embodiment of FIGS. 1, 2 and 3, resulting in reduced size. The embodiment of FIG. 6 omits the delay line 24, and enables image attenuation in more than one Nyquist zone. The performance depends upon the magnitude and phase response of the analog phase shifter 58.

Figure 7:
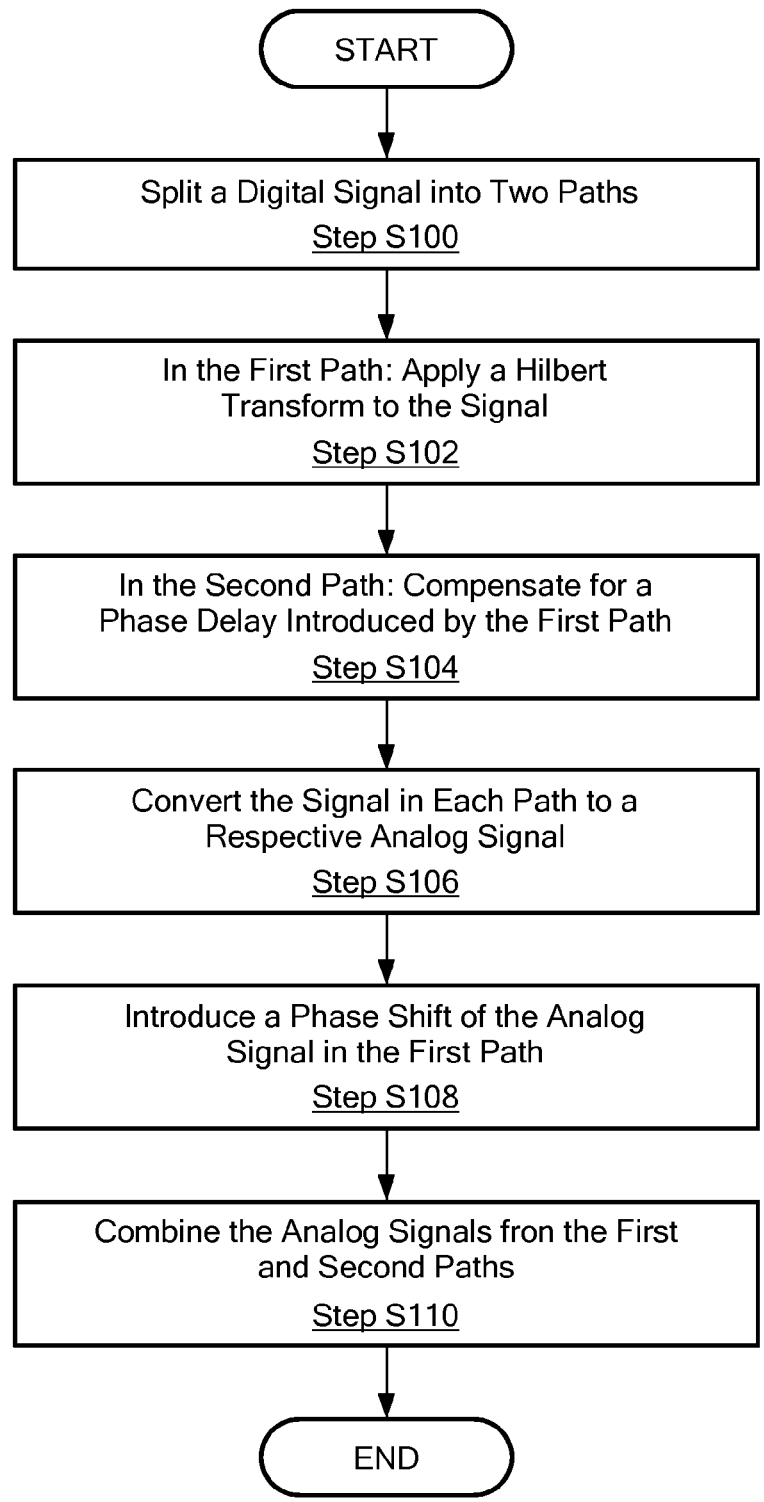
FIG. 7 is a flow chart of an exemplary embodiment for producing a filtered analog signal for transmission.

FIG. 7 is a flow chart of an exemplary embodiment for producing a filtered analog signal that has a suppressed first replica of an image spectra of the signal and a reinforced second replica of the image spectra of the signal. A digital signal is split into two electrically parallel paths (step S100). In the first one of the two paths, a Hilbert transform or other anti-symmetric phase transform is applied to the signal (step S102). In the second one of the two paths, phase compensation is applied to the signal in the second path to compensate for phase delay of the signal in the first path caused by the digital components of the first path (step S104). The signals in each path are converted to an analog signal in each path (step S106). The analog signal in the first path is phase-shifted by an analog phase shifter (step S108). The analog signals from each path are combined (step S110).

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A device for converting a digital input signal to an analog signal, the device comprising:
    a first signal path having:
        a transformer, the transformer phase shifting replicas of image spectra of the digital input signal that fall in even Nyquist zones by substantially a first predetermined amount and phase shifting replicas of the image spectra that fall in odd Nyquist zones by substantially a negative of the first predetermined amount; and a first digital-to-analog converter, DAC, in communication with the transformer, the first DAC converting a first digital signal in the first path to a first analog signal in the first path;

a second path having:
  a coarse delay compensator, the coarse delay compensator delaying the digital input signal an integer number of clock cycles; and
  a second DAC in communication with the coarse delay compensator, the second DAC converting a second digital signal in the second path to a second analog signal in the second path; and a combiner, the combiner combining the first analog signal in the first path and the second analog signal in the second path, the combiner producing an output signal with at least one replica of the image spectra being substantially suppressed.

2. The device of claim 1, wherein the second path further includes a delay line providing a phase shift of substantially the first predetermined amount at a sampling frequency of the second digital signal in the second path.

3. The device of claim 1, further comprising a quadrature modulator, and wherein the digital input signal includes an I channel digital signal and a Q channel digital signal, the I an Q channel digital signals being combined by the quadrature modulator.

4. The device of claim 1, wherein the transformer is a Hilbert transformer and the first path further comprises a real tap filter providing fine tuning of a group delay response of the Hilbert transformer.

5. The device of claim 4, wherein the real tap filter is an all-pass filter.

6. The device of claim 1, wherein the first path includes an interpolator up-sampling a signal in the first path, and the second path further include an interpolator up-sampling a signal in the second path.

7. The device of claim 1, further comprising a quadrature modulator coupled to the first path and the second path, the quadrature modulator performing an intermediate frequency, IF, conversion of the digital signal before splitting the digital signal to the first and second path.

8. The device of claim 1, wherein the second path further includes a complex filter and a first quadrature modulator before the coarse delay compensator, and the first path further includes a second quadrature modulator before the Hilbert transformer, the complex filter compensating for a phase response of the first path.

9. The device of claim 1, wherein the second path further includes a rotator and a first quadrature modulator before the coarse delay compensator, and the first path further includes a second quadrature modulator before the Hilbert transformer, the rotator compensating for a phase response of the first path.

10. The device of claim 1, wherein the first analog signal of the first path and the second analog signal of the second path are combined at an analog quadrature modulator.

11. The device of claim 1, wherein the first predetermined amount is 90 degrees.

12. A method of suppressing image spectra of a digital input signal, the method comprising:
  splitting the digital input signal into a first path and a second path;
  the first path having:
    a Hilbert transformer, the Hilbert transformer phase shifting image spectra of the digital input signal falling in even Nyquist zones by substantially +90 degrees and phase shifting image spectra of the digital input signal falling in odd Nyquist zones by substantially −90 degrees to produce a first digital signal;
    a first digital-to-analog converter, the first digital-to-analog converter converting the first digital signal to a first analog signal; and
    an analog phase delay device, the analog phase delay device delaying the first analog signal by an additional 90 degrees; and
  the second path having:
    a compensation device, compensating for a phase delay introduced by the Hilbert transformer and the first DAC of the first path to produce a second digital signal; and
    a second digital-to-analog converter, the second digital-to-analog converter converting the second digital signal to a second analog signal;
  combining the first and second analog signals from the two paths to produce an output analog signal with at least one replica of the image spectra that is substantially suppressed.

13. The method of claim 12, further comprising up-sampling the digital signal in each path.

14. The method of claim 12, further comprising introducing a delay in the first path to phase shift an analog signal in the first path substantially by an additional −90 degrees.

15. The method of claim 12, wherein the compensation device phase shifts a signal of the first path by an integer number of clock cycles.

16. The method of claim 12, further comprising modulating a carrier using the digital input signal prior to splitting the digital input signal into two paths.

17. A radio frequency, RF, device, comprising;
  a first path having:
    a transformer arranged to phase shift replicas of an image spectra of a digital input signal; and
    a first digital-to-analog converter, DAC, converting an output of the transformer to a first analog signal;
  a second path having:
    a compensator arranged to compensate for a group delay response of at least the transformer; and
    a second DAC converting an output of the compensator to a second analog signal; and
  a combiner to combine the first and second analog signals, the combining producing an analog output signal having at least one substantially suppressed replica of the image spectra.

18. The RF device of claim 17, wherein the transformer phase-shifts each replica falling in an even Nyquist zone by +ϕ and phase-shifts each replica falling in an odd Nyquist zone by −ϕ, where ϕ is a predetermined phase.

19. The RF device of claim 18, further comprising a delay device, the delay device phase shifting the first analog signal by −ϕ so that the first analog signal has a total phase shift of 0 in even Nyquist zones and −2ϕ in odd Nyquist zones.

20. The RF device of claim 17, wherein the compensator introduces a delay that is an integer number of clock cycles.

* * * * *

UNITED STATES PATENT AND TRADEMARK OFFICE
CERTIFICATE OF CORRECTION

PATENT NO.         : 8,493,258 B1                                               Page 1 of 1
APPLICATION NO.    : 13/403660
DATED              : July 23, 2013
INVENTOR(S)        : Wyville et al.

It is certified that error appears in the above-identified patent and that said Letters Patent is hereby corrected as shown below:

In the Claims

In Column 7, Line 24, in Claim 3, delete "I an" and insert -- I and --, therefor.

Signed and Sealed this
Twenty-fourth Day of December, 2013

Margaret A. Focarino
*Commissioner for Patents of the United States Patent and Trademark Office*